(12) United States Patent
Honjou et al.

(10) Patent No.: US 6,909,649 B2
(45) Date of Patent: Jun. 21, 2005

US006909649B2

(54) SEMICONDUCTOR DEVICE AND SEMICONDUCTOR INTEGRATED CIRCUIT

(75) Inventors: Tomonori Honjou, Kawasaki (JP); Katsuya Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 6 days.

(21) Appl. No.: 10/618,725

(22) Filed: Jul. 15, 2003

(65) Prior Publication Data

US 2004/0015807 A1 Jan. 22, 2004

(30) Foreign Application Priority Data

Jul. 16, 2002 (JP) ........................................ 2002-207335

(51) Int. Cl.[7] ................................................ G11C 7/00
(52) U.S. Cl. ............................ 365/201; 365/51; 365/63
(58) Field of Search ............................. 365/63, 201, 51

(56) References Cited

U.S. PATENT DOCUMENTS 5,987,635 A * 11/1999 Kishi et al. ................. 714/724
6,650,583 B2 * 11/2003 Haraguchi et al. .......... 365/201
6,707,735 B2 * 3/2004 Makabe et al. ............. 365/201

* cited by examiner

*Primary Examiner*—Son T. Dinh
(74) *Attorney, Agent, or Firm*—Arent Fox, PLLC

(57) ABSTRACT

A control circuit of a first chip generates control signals for operating a second chip. The first chip and the second chip are manufactured by mutually different processes and packed in a single package. A test control circuit of the first chip inhibits the control signals from being transmitted to the second chip when the first chip is under test. Consequently, the transistors and other components of the second chip are prevented from undergoing stress during a burn-in test on the first chip, for example. As a result, it is possible to conduct a test on the semiconductor device implementing the first chip and second chip whose test conditions are different, with stress applied to the first chip alone.

19 Claims, 10 Drawing Sheets

SEMICONDUCTOR DEVICE AND SEMICONDUCTOR INTEGRATED CIRCUIT

CROSS REFERENCE TO RELATED APPLICATION

This application is based upon and claims the benefit of priority from the prior Japanese Patent Application No. 2002-207335, filed Jul. 16, 2002, the entire contents of which are incorporated herein by reference.

BACKGROUND OF THE INVENTION

1. Field of the Invention

The present invention relates to a semiconductor device having a plurality of semiconductor chips packed in a single package which constitutes a system.

In particular, the present invention relates to a test circuit to be implemented in the foregoing semiconductor device.

2. Description of the Related Art

Semiconductor devices have been recently developed which contain a logic chip, a memory chip, and the like of different process technologies in a single package and operate as a system each. The semiconductor devices of this type are called multi chip packages (hereinafter, referred to as MCPs) or multi chip modules (hereinafter, referred to as MCMs).

In general, semiconductor devices are subjected to a burn-in test in their test process. The burn-in test is an acceleration test in which a plurality of semiconductor devices mounted on a test board are operated at high temperature and high voltage for predetermined time in order to reject initial failures of transistors and the like in a short time.

The test conditions of the burn-in test must be set optimally for each manufacturing process so that initial failures are rejected with reliability. For this reason, the burn-in test conditions differ between logic chips and memory chips. For example, logic chips are burn-in tested at 125° C. Memory chips are burn-in tested at 100° C.

In the case of MCPs implementing a logic chip and a memory chip in a single package, however, both the logic chip and the memory chip must be burned in under the same test condition. If the burn-in test is run on the semiconductor devices under a loose one of the test conditions for the respective chips, initial failures might not be fully rejected of the chips whose test conditions are severer. If the burn-in test is run on the semiconductor devices under a strict one of the test conditions for the respective chips, the chips having loose test conditions undergo excessive stress, which may increase a failure ratio.

To avoid the foregoing problems, MCPs have conventionally implemented logic chips that are manufactured by time-proven processes and thus require no burn-in test, for example. In this case, a 100° C. burn-in test can be conducted to reject initial failures of the memory chips implemented in the MCPs.

SUMMARY OF THE INVENTION

It is an object of the present invention to conduct a reliable burn-in test on a semiconductor device that implements a plurality of chips whose test conditions are different from each other.

Another object of the present invention is to test a plurality of chips implemented in a semiconductor device under respective optimum test conditions.

According to one of the aspects of the present invention, a control circuit of a first chip (semiconductor integrated circuit) generates control signals for operating a second chip (semiconductor chip). The first chip and the second chip are manufactured by mutually different manufacturing processes and packed in a single package. A test control circuit of the first chip inhibits the control signals from being transmitted to the second chip while the first chip is tested. That is, during the test on the first chip, the second chip is prevented from being operative. Consequently, transistors and the like of the second chip are prevented from undergoing stress during a burn-in test on the first chip, for example. As a result, the semiconductor device implementing both of the first chip and the second chip can be burn-in tested with stress applied only to the first chip.

For example, the first chip is a logic chip, and the second chip is a memory chip. In general, the manufacturing process of memory chips is more complicated than that of logic chips. On this account, memory chips are set to be burn-in tested at a lower temperature than logic chips. The present invention makes it possible to test each of a plurality of such semiconductor chips having different test conditions and implemented in the semiconductor device under respective optimum conditions.

According to another aspect of the present invention, the semiconductor device comprises a first power supply terminal intended for the first chip and a second power supply terminal intended for the second chip. That is, the first chip and the second chip have separate power supplies. The test control circuit controls output of all of the control signals to be supplied to the second chip. Consequently, stopping supplying the power supply voltage to the second power supply terminal during a burn-in test on the first chip, for example, brings the second chip into a state equivalent to a state of high temperature storage. As a result, it is possible to surely prevent transistors and the like of the second chips from undergoing stress due to electric fields during the test on the first chip.

According to another aspect of the present invention, the semiconductor device comprises a power supply terminal common to the first chip and the second chip. While the first chip is tested, the test control circuit inhibits output of an enable signal for activating the second chip. Consequently, during the test on the first chip, the second chip receives a power supply voltage but not the enable signal. The second chip is thus inactivated so that it is able to avoid the second chip from being given stress.

According to another aspect of the present invention, the first chip enters a test mode upon receiving a test signal at its test terminal. A test starting circuit of the first chip is activated upon reception of the test signal to output a test starting signal in accordance with the logic of a signal input to an input terminal of the first chip. Here, the input terminal is a terminal for receiving an input signal used in normal operation. The test control circuit inhibits the control signals from being transmitted to the second chip when it receives the test starting signal. It is therefore possible to run a desired test out of a plurality of tests by using the input terminal which is used in normal operation.

According to another aspect of the present invention, a test starting circuit of the first chip outputs a test starting signal in accordance with the logic combination of signals which are input to an input terminal of the first chip a plurality of times. Here, the input terminal is a terminal for receiving an input signal used in normal operation. The test control circuit inhibits the control signals from being transmitted to the second chip when it receives the test starting signal. It is therefore possible to run a desired test out of a plurality of tests by using the input terminal used in normal operation.

According to another aspect of the present invention, a first chip and a second chip manufactured by mutually different manufacturing processes are packed in a single package. The semiconductor device comprises a first power supply terminal intended for an internal circuit of the first chip, a second power supply terminal intended for an internal circuit of the second chip, and a third power supply terminal intended for input/output circuits of the first and second chips. That is, the internal circuit of the first chip, the internal circuit of the second chip, and the input/output circuits of the first and second chips have separate power supplies. A control circuit of the first chip generates control signals for operating the second chip.

A test control circuit is formed not in the first chip but in the second chip. The test control circuit operates on a power supply voltage supplied to the third power supply terminal and inhibits the control signals from being transmitted to the internal circuit of the second chip while the first chip is tested. Consequently, the second chip enters a state equivalent to a state of high temperature storage by supplying their power supply voltages to the first and third power supply terminals and stopping supplying its power supply voltage to the second power supply terminal during a burn-in test on the first chip, for example. Since the test control circuit is formed on the second chip, it is able to prevent with facility the second chip from being given stress even if the first chip is a general-purpose chip in particular.

According to another aspect of the present invention, a test starting terminal receives a test starting signal for testing the first chip. The test control circuit inhibits transmission of the control signals when it receives the test starting signal. The first chip can thus be tested easily by simply supplying a predetermined voltage to its test starting terminal.

According to another aspect of the present invention, output inhibition circuits of the test control circuit set output nodes of the control signals to be in a high impedance state while the first chip is tested. The second chip can thus be brought into the state of high temperature storage with facility and reliability during a burn-in test, for example.

According to another aspect of the present invention, high level fixing circuits of the test control circuit fix a level of output nodes of the control signals to the second chip to high level while the first chip is tested. Connecting the outputs of the high level fixing circuits to input terminals of the second chip that are in an activated state when at low level, for example, enables the second chip to enter an inactivated state with sureness during the test on the first chip.

According to another aspect of the present invention, low level fixing circuits of the test control circuit fix a level of output nodes of the control signals to the second chip to low level while the first chip is tested. Connecting the outputs of the low level fixing circuits to input terminals of the second chip that are in an activated state when at high level, for example, enables the second chip to surely enter an inactivated state during the test on the first chip.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 1:
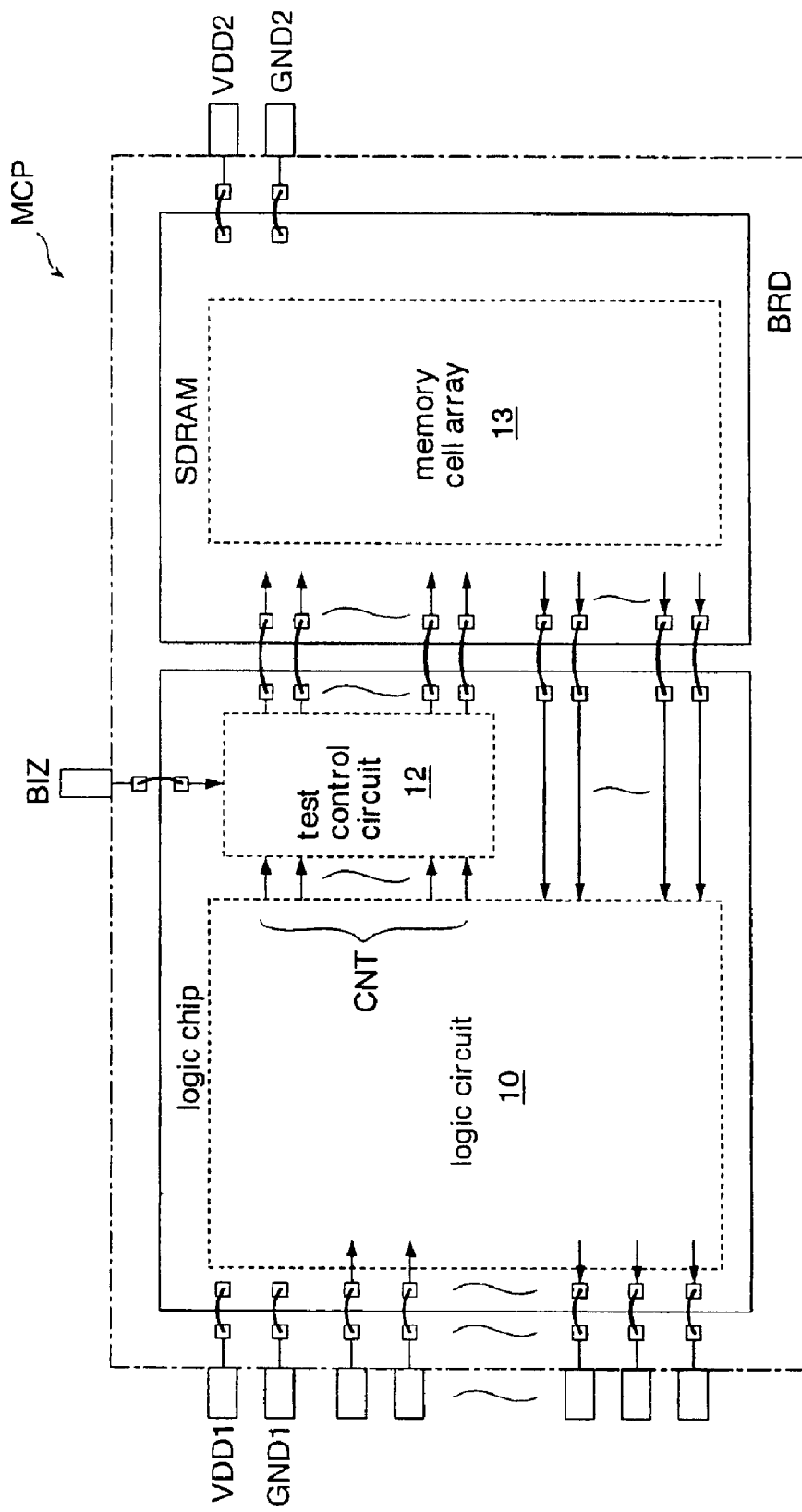
FIG. 1 is a block diagram showing a first embodiment of the present invention.

FIG. 1 shows a first embodiment of the semiconductor device of the present invention. This semiconductor device is formed as an MCP, having a logic chip (first chip) and an SDRAM (second chip) mounted on a package board BRD. The manufacturing process of the SDRAM uses semiconductor elements having characteristics different from those of the logic chip with a memory cell forming process added thereto. That is, the manufacturing processes of the SDRAM and those of the logic chip are different from each other. Generally, the logic chip itself is burn-in tested at 125° C., and the SDRAM itself is burn-in tested at 100° C.

The package board BRD has a first power supply terminal VDD1 and a first ground terminal GND1 to be connected with the power supply terminal and ground terminal of the logic chip, respectively, a second power supply terminal VDD2 and a second ground terminal GND2 to be connected with the power supply terminal and ground terminal of the SDRAM, respectively, a test control terminal BIZ to be connected with the test control terminal of the logic chip, and terminals to be connected with the input terminals and output terminals of the logic chip.

The logic chip has a logic circuit (control circuit) 10 for generating a plurality of control signals CNT to operate the SDRAM and receiving data from the SDRAM, and a test control circuit 12. Aside from the SDRAM control function, the logic circuit 10 also has predetermined functions such as data processing. The test control circuit 12 receives the SDRAM control signals CNT output from the logic circuit 10, and transmits the control signals CNT to the SDRAM when a test starting signal BIZ is at low level. When the test starting signal BIZ is at high level, the test control circuit 12 inhibits the control signals CNT from being transmitted to the SDRAM. The control signals CNT to be supplied from the logic chip to the SDRAM are all output to the SDRAM through the test control circuit 12.

The SDRAM has a memory cell array 13, and a control circuit, input/output circuit, and the like (not shown) for operating the memory cell array 13. The external terminals of the SDRAM are all connected to the logic chip. That is, the SDRAM operates in response to the control signals CNT from the logic chip. Data read from the memory cell array 13 is output to exterior of the MCP through the logic chip.

Figure 2:
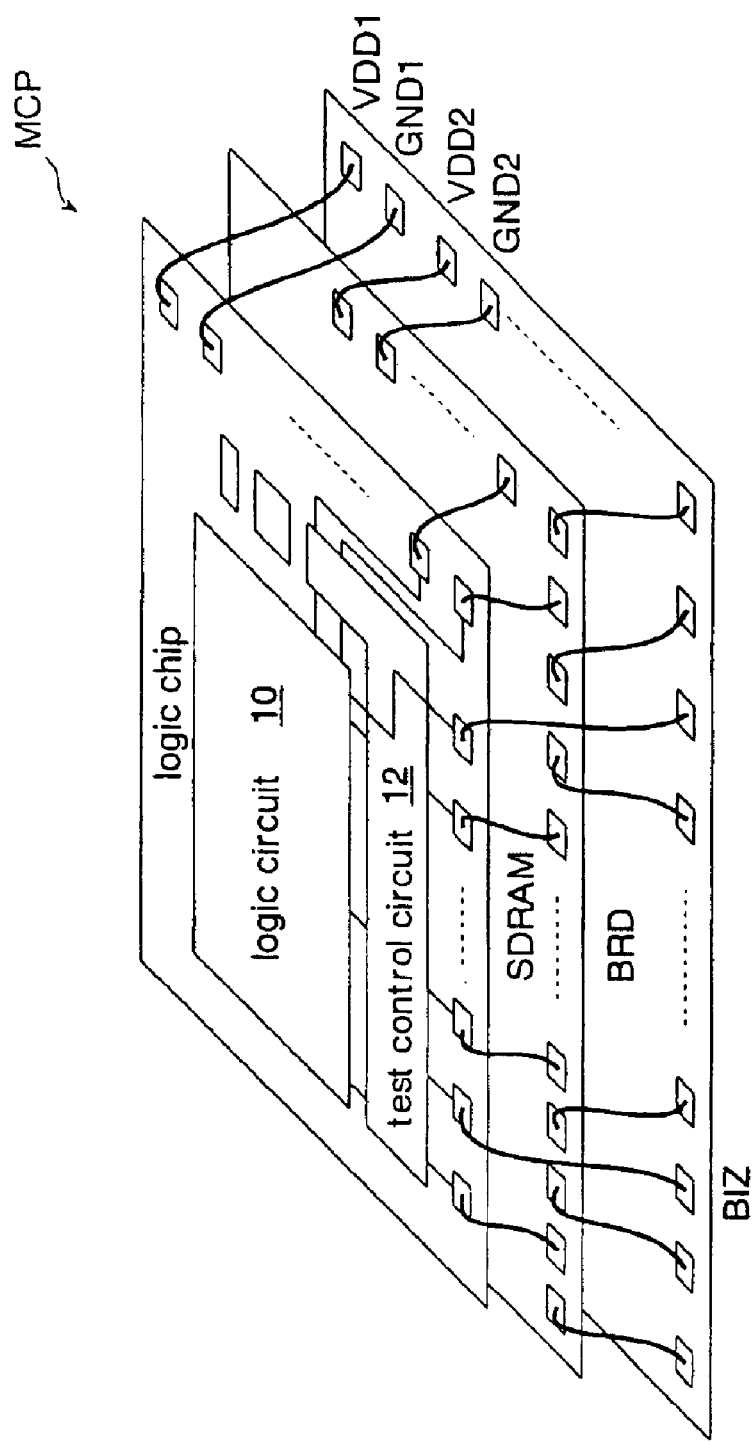
FIG. 2 is a perspective view showing the structure of the MCP of FIG. 1.

FIG. 2 shows the structure of the MCP shown in FIG. 1. In this embodiment, the SDRAM and the logic chip are laminated on the package board BRD. The package board BRD, the SDRAM, and the logic chip are connected to one another with bonding wires. Note that the present invention is not limited to MCPs of laminated structure. For example, the present invention may be applied to an MCM which has a logic chip and an SDRAM arranged in parallel on its package board.

Figure 3:
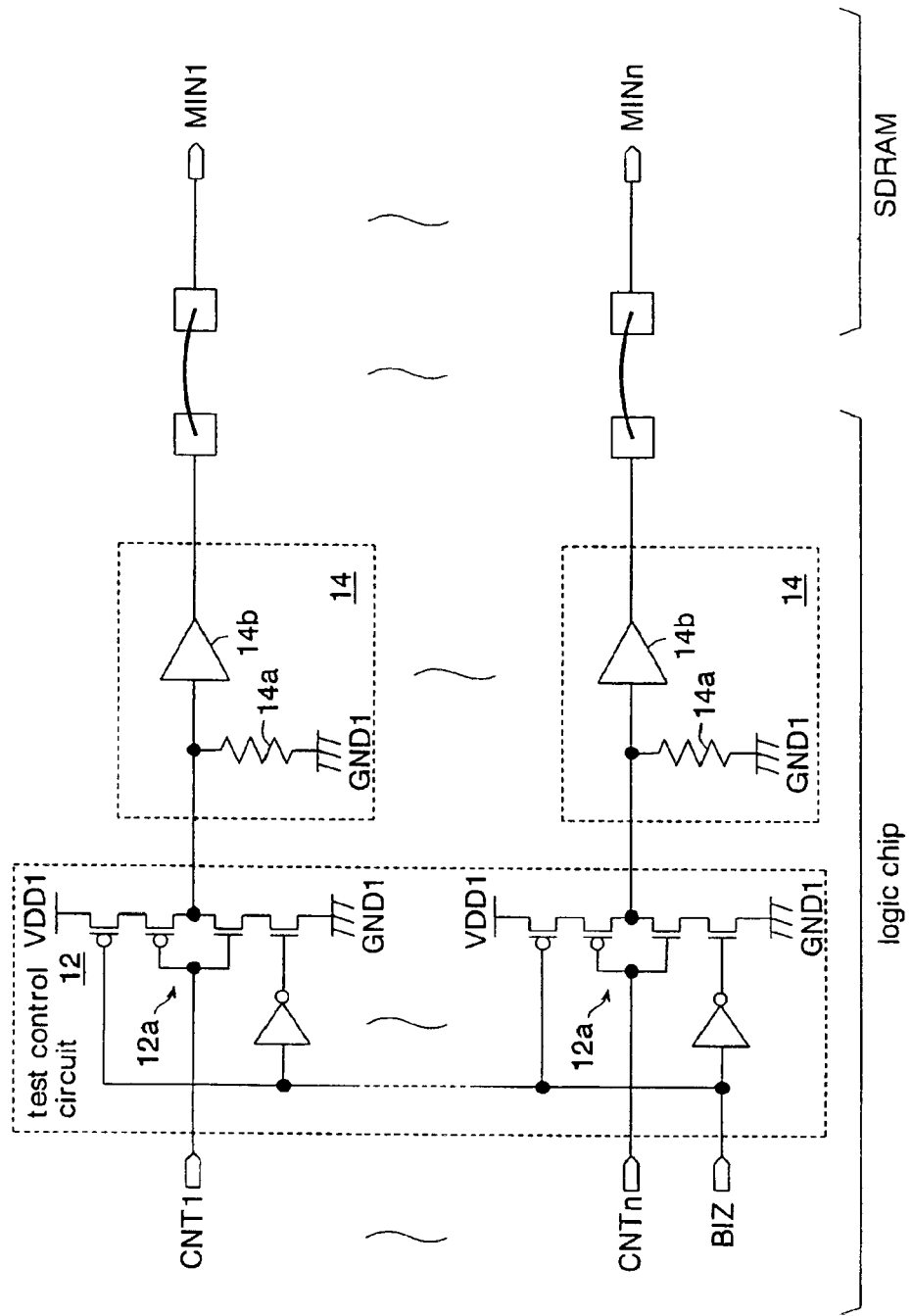
FIG. 3 is a circuit diagram showing the details of the test control circuit of FIG. 1.

FIG. 3 shows the details of the test control circuit 12 shown in FIG. 1.

The test control circuit 12 has clocked inverters 12a (output inhibition circuits) corresponding to the respective control signals CNT (CNT1, . . . , CNTn) for operating the SDRAM. When the clocked inverters 12a receive the test starting signal BIZ of low level, they output the inverted signals of the control signals CNT to IO cells 14 (test control circuit), respectively. Upon receiving the test starting signal BIZ of high level, the clocked inverters 12a set their outputs to high impedance in order to inhibit the control signals CNT from being output to the IO cells 14.

The IO cells 14 have a pull-down resistor 14a and an output buffer 14b each. When the clocked inverters 12a are off, the pull-down resistors 14a supply the input terminals MIN1, . . . , MINn of the SDRAM with a low level. Here, the buffers 14b may be formed not in the logic chip but in the SDRAM.

Now, description will be given of the MCP burn-in test mentioned above. The MCP burn-in test is conducted on the logic chip and the SDRAM separately.

Initially, a plurality of MCPs are mounted on a test board. The test board is put in a test oven (125° C.). Next, the first power supply terminals VDD1 and the first ground terminals GND1 in connection with the logic chips are exclusively connected with power supply lines, so that predetermined voltages are supplied to these terminals VDD1 and GND1. The second power supply terminals VDD2 and the second ground terminals GND2 in connection with the SDRAMs are not connected with any power supply line.

Subsequently, a high level is supplied to the test control terminals BIZ, whereby the clocked inverters 12a of the test control circuits 10 are inactivated. Next, test signals are given to the input terminals of the logic chips to operate the logic circuits 10 shown in FIG. 1, effecting the burn-in test on the logic chips. Here, no power supply is provided to the SDRAMs. Besides, all the input terminals MIN1, . . . , MINn of the SDRAMs are supplied with the low level. The SDRAMs are thus in a state equivalent to where they are stored at high temperature. In general, the test specification for the SDRAM high temperature storage is higher than 125° C. Thus, during the burn-in test on the logic chips, the transistors and other components in the SDRAMs will not suffer stress for degradation. In other words, according to the present invention, only those desired out of a plurality of semiconductor chips implemented in the MCPs undergo the burn-in test.

After the burn-in test on the logic chips, the SDRAMs are subjected to a burn-in test in a 100° C. test oven. Here, the first power supply terminals VDD1, the first ground terminals GND1, the second power supply terminals VDD2, and the second ground terminals GND2 are connected with power supply lines, so that predetermined voltages are supplied to these terminals VDD1, GND2, VDD2, and GND2. That is, both the logic chips and the SDRAMs are provided with the power supplies.

The test starting terminals BIZ are set at low level to activate the clocked inverters 12a of the test control circuits 12. Test signals are given to the input terminals of the logic chips to operate the logic circuits 10. Control signals CNT (test patterns) generated by the logic circuits 10 are transmitted to the SDRAMs through the clocked inverters 12a. Then, the SDRAM burn-in test is effected.

Note that during the burn-in test on the SDRAMs, the internal circuits of the logic chips are also operated. On this account, the foregoing 125° C. burn-in test on the logic chips may be conducted under the condition excluding the stress for the logic chips to undergo during the 100° C. burn-in test on the SDRAMs, if required.

As above, according to the present embodiment, during the burn-in test on the logic chip, the test control circuit 12 inhibits the control signals CNT from being transmitted to the SDRAM and thereby precludes the operation of the SDRAM. It is therefore possible to prevent the transistors and other components of the SDRAM from undergoing stress. Consequently, such a semiconductor device as an MCP implementing a plurality of semiconductor chips of different test conditions can be tested on the individual chips under respective optimum conditions.

The power supply VDD1, GND1 of the logic chip and the power supply VDD2, GND2 of the SDRAM are separated from each other. The SDRAM can thus be put into a state equivalent to a state of high temperature storage during the burn-in test on the logic chip. As a result, the transistors and other components of the SDRAM can be surely prevented from undergoing stress due to electric fields, thus avoiding element degradation.

There is provided the test starting terminal BIZ which receives the test starting signal for conducting a burn-in test on the logic chip. Consequently, the burn-in test can be conducted easily by simply supplying a high level voltage to the test starting terminal BIZ.

During the burn-in test on the logic chip, the clocked inverters 12a of the test control circuit 12 set the output nodes of the control signals CNT to be in a high impedance state. The SDRAM can thus be put into the state equivalent to a state of high temperature storage with facility and reliability.

Figure 4:
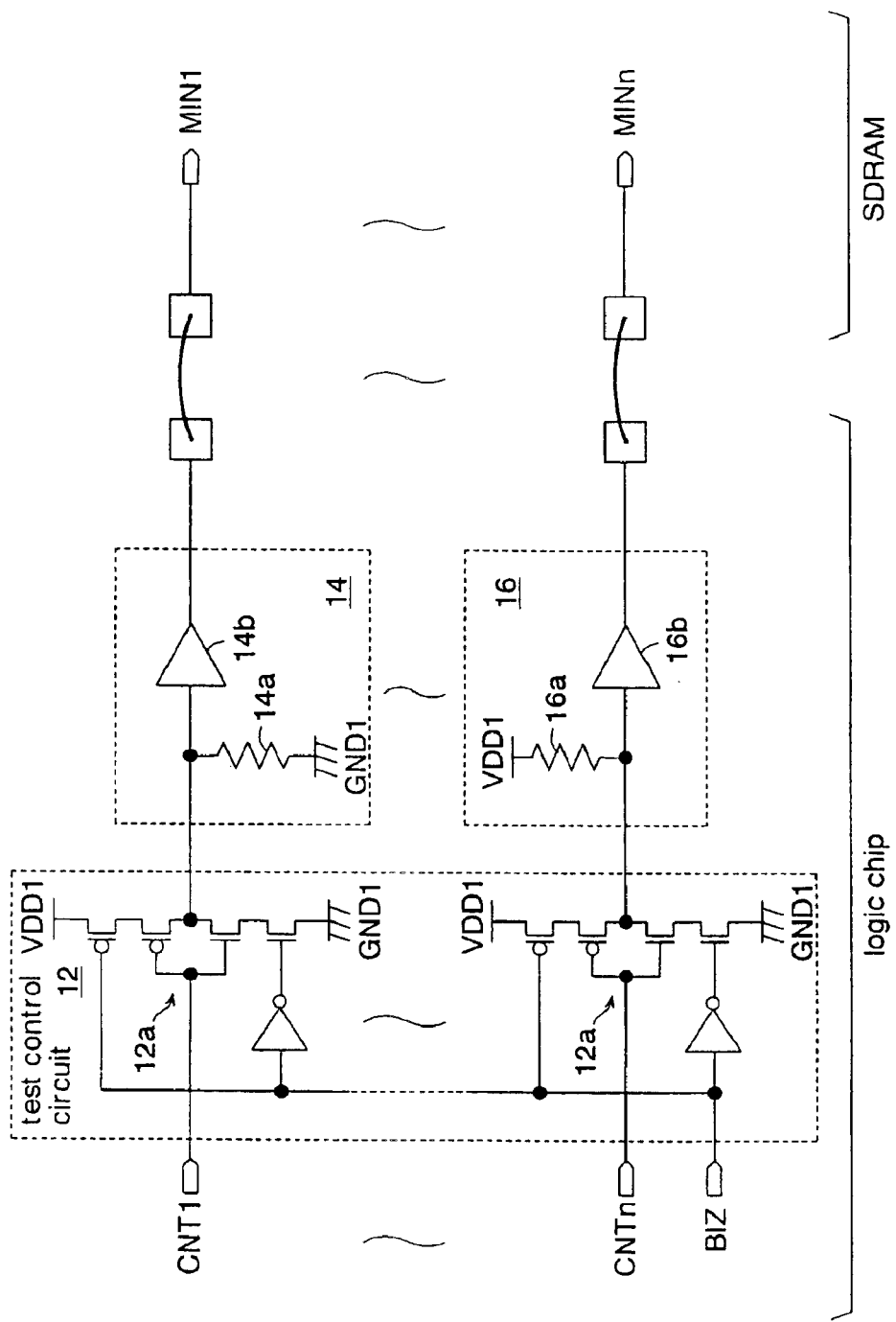
FIG. 4 is a circuit diagram showing essential parts of a second embodiment of the present invention.

FIG. 4 shows essential parts of a second embodiment of the semiconductor device of the present invention. The same elements as those of the first embodiment will be designated by identical reference numbers or symbols. Detailed description thereof will be omitted here.

In this embodiment, the outputs of the test control circuit 12 are connected to IO cells 14 each having a pull-down resistor 14a or IO cells 16 each having a pull-up resistor 16a. The rest of the configuration is the same as in the first embodiment. Note that the buffers 14b and 16b may be formed in the SDRAM, not the logic chip.

The IO cells 14, having a pull-down resistor, are connected to input terminals that are in an activated state when at high level (for example, a clock enable terminal CKE). The IO cells 16 having a pull-up resistor are connected with input terminals that are in an activated state when at low level (for example, a chip select terminal /CS, a row address strobe terminal /RAS, a column address strobe terminal /CAS, and a write enable terminal /WE). Input terminals to be supplied with a low level and a high level selectively (for example, address terminals) are connected with either of the IO cells 14, 16 depending on the specifications. The rest of the configuration is the same as in the first embodiment.

In this embodiment, the burn-in test on the logic chip is conducted as in the first embodiment. Here, no voltage is supplied to the power supply terminal VDD2 and the ground terminal GND2 of the SDRAM. The input terminals of the SDRAM are supplied with a low level or high level from either of the IO cells 14, 16 so that the SDRAM is surely kept in an inactivated state. Consequently, during the burn-in test on the logic chip, the SDRAM is in the state equivalent to a state of high temperature storage with no stress given on the SDRAM.

This embodiment can offer the same effects as those of the first embodiment described above.

Figure 5:
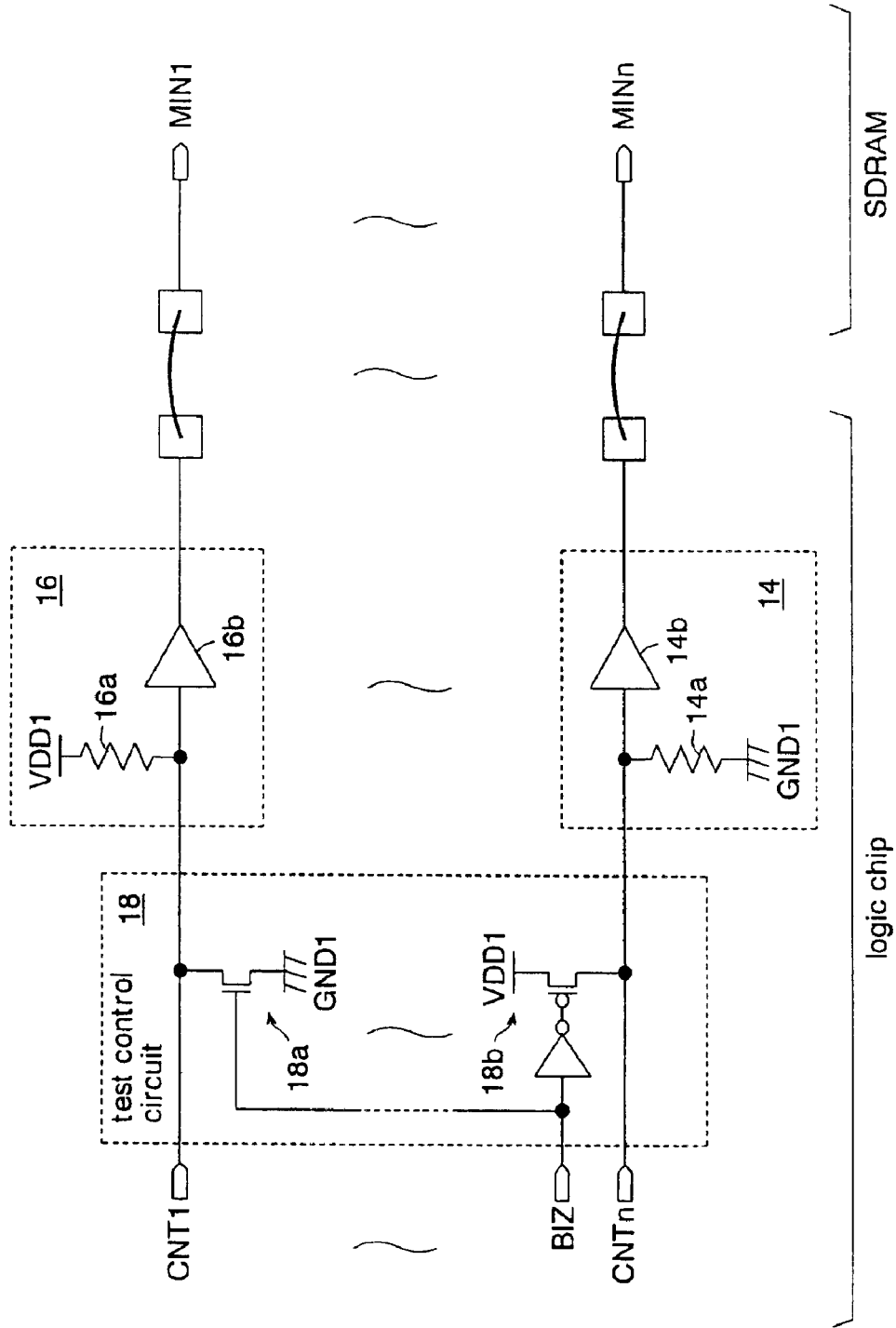
FIG. 5 is a circuit diagram showing essential parts of a third embodiment of the present invention.

FIG. 5 shows essential parts of a third embodiment of the semiconductor device of the present invention. The same elements as those of the first and second embodiments will be designated by identical reference numbers or symbols. Detailed description thereof will be omitted here.

In this embodiment, a test control circuit 18 is formed instead of the test control circuit 12 of the first embodiment. The outputs of the test control circuit 18 are connected with IO cells 16 each having a pull-up resistor or IO cells 14 each having a pull-down resistor. The IO cells 16, having a pull-up resistor, are connected to input terminals that are in an activated state when at high level. The IO cells 14, having a pull-down resistor, are connected to input terminals that are in an activated state when at low level, in contrast to the first embodiment. Note that the buffers 14b and 16b may be formed in the SDRAM, not the logic chip. The rest of the configuration is the same as in the first embodiment.

The test control circuit 18 has nMOS transistors 18a (low level fixing circuits) and pMOS transistors 18b (high level fixing circuits) which forcefully set the transmission nodes of the control signals CNT output from the logic circuit 10 of the logic chip shown in FIG. 1 at low level and high level, respectively. The sources of the nMOS transistors 18a are connected to the first ground terminal GND1. The sources of the pMOS transistors 18b are connected to the first power supply terminal VDD1. The nMOS transistors 18a and the pMOS transistors 18b turn on when the test starting signal BIZ is at high level. The transmission nodes in connection with the nMOS transistors 18a are connected to the 10 cells 16 which have a pull-up resistor. The transmission nodes in connection with the pMOS transistors 18b are connected to the IO cells 14 which have a pull-down resistor.

In this embodiment, no voltage is supplied to the power supply terminal VDD2 and the ground terminal GND2 of the SDRAM during the burn-in test on the logic chip. Moreover, the turning-on of the nMOS transistors 18a supplies a low level or an inactivation level to, for example, the SDRAM's input terminal MIN1 which is in an activated state when at high level. The turning-on of the nMOS transistors 18b supplies a high level or an inactivation level to, for example, the SDRAM's input terminal MINn which is in an activated state when at low level. Consequently, during the burn-in test on the logic chip, the SDRAM is in a state equivalent to a state of high temperature storage. That is, the SDRAM undergoes no stress during the burn-in test on the logic chip.

This embodiment can offer the same effects as those of the first embodiment described above. Besides, during the burn-in test on the logic chip, the drains of the nMOS transistors 18a in the test control circuit 18 are connected via the IO cells 16 to the terminals of the SDRAM that are in an activated state when at high level (such as MIN1). Moreover, the drains of the pMOS transistors 18b in the test control circuit 18 are connected via the IO cells 14 to the terminals of the SDRAM that are in an activated state when at low level (such as MINn). Thus, the SDRAM can be surely put into an inactivated state during the burn-in test on the logic chip.

Figure 6:
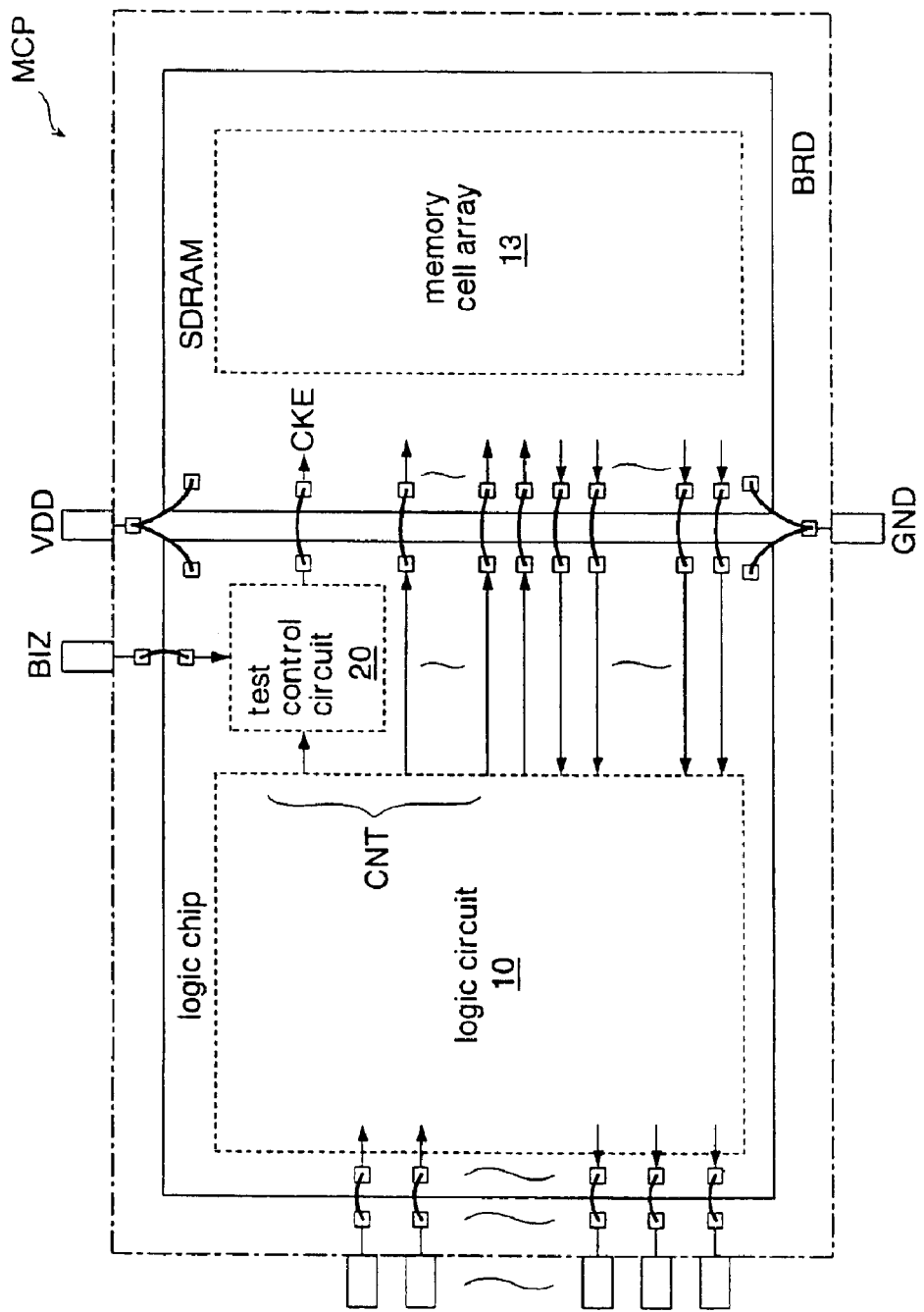
FIG. 6 is a block diagram showing a fourth embodiment of the present invention.

FIG. 6 shows a fourth embodiment of the semiconductor device of the present invention. The same elements as those of the first and second embodiments will be designated by identical reference numbers or symbols. Detailed description thereof will be omitted here.

In this embodiment, the package board BRD of the MCP has a power supply terminal VDD and a ground terminal GND to be connected with the power supply terminals and ground terminals of the logic chip and the SDRAM, respectively, a test control terminal BIZ to be connected with the test control terminal of the logic chip, and terminals to be connected with the input terminals and output terminals of the logic chip. That is, the logic chip and the SDRAM are connected to the common power supply terminal VDD and ground terminal GND. Consequently, during the burn-in test on the logic chip, the power supply voltage is provided not only to the logic chip but also to the SDRAM.

The logic chip has a logic circuit 10 and a test control circuit 20. The test control circuit 20 has a clocked inverter 12a (not shown) for inhibiting a signal corresponding to the clock enable signal CKE, out of the control signals CNT, from being transmitted to the SDRAM. As in the first embodiment (FIG. 3), the clocked inverter 12a are inactivated when the test starting signal BIZ is at high level.

As above, in the present embodiment, only the control signals CNT corresponding to the clock enable signal CKE are transmitted to the SDRAM through the test control circuit 20. A clock signal CLK, a chip select signal /CS, a write enable signal /WE, address signals AD, and the like are transmitted from the logic circuit 10 to the SDRAM directly.

In the logic chip, the IO cell (not shown) for outputting the clock enable signal CKE has a pull-down resistor. When the clocked inverters 12a of the test control circuit 20 are inactivated, the clock enable signal CKE to be output from the logic chip is fixed to low level.

During the burn-in test on the logic chip, the SDRAM is provided with its power supply. The internal circuit of the SDRAM is thus in an operable state. Upon receiving the clock enable signal CKE of high level, the SDRAM activates its clock buffer to transmit the clock signal CLK to the internal circuit. Input buffers for the chip select signal /CS, the address signals AD, and the like operate in response to the clock signal CLK. Upon receiving the clock enable signal CKE of low level, the SDRAM inactivates the clock buffer to inhibit the clock signal CLK from being transmitted to the internal circuit. The input buffers are inactivated here. The SDRAM thus enters a standby state (to be precise, a low power consumption state where the clock buffer is not in operation).

In the standby state mentioned above, the memory cell array 13 of the SDRAM makes no operation. The memory cell array 13 thus undergoes no stress during the burn-in test on the logic chip.

This embodiment can offer the same effects as those of the first embodiment described above. Moreover, when the power supply is common to the logic chip and the SDRAM, the clock enable signal CKE stops being supplied to the SDRAM during the burn-in test on the logic chip. It is therefore possible to preclude the operation of the memory cell array 13 in the SDRAM, thereby preventing the memory cell array 13 from undergoing stress.

Figure 7:
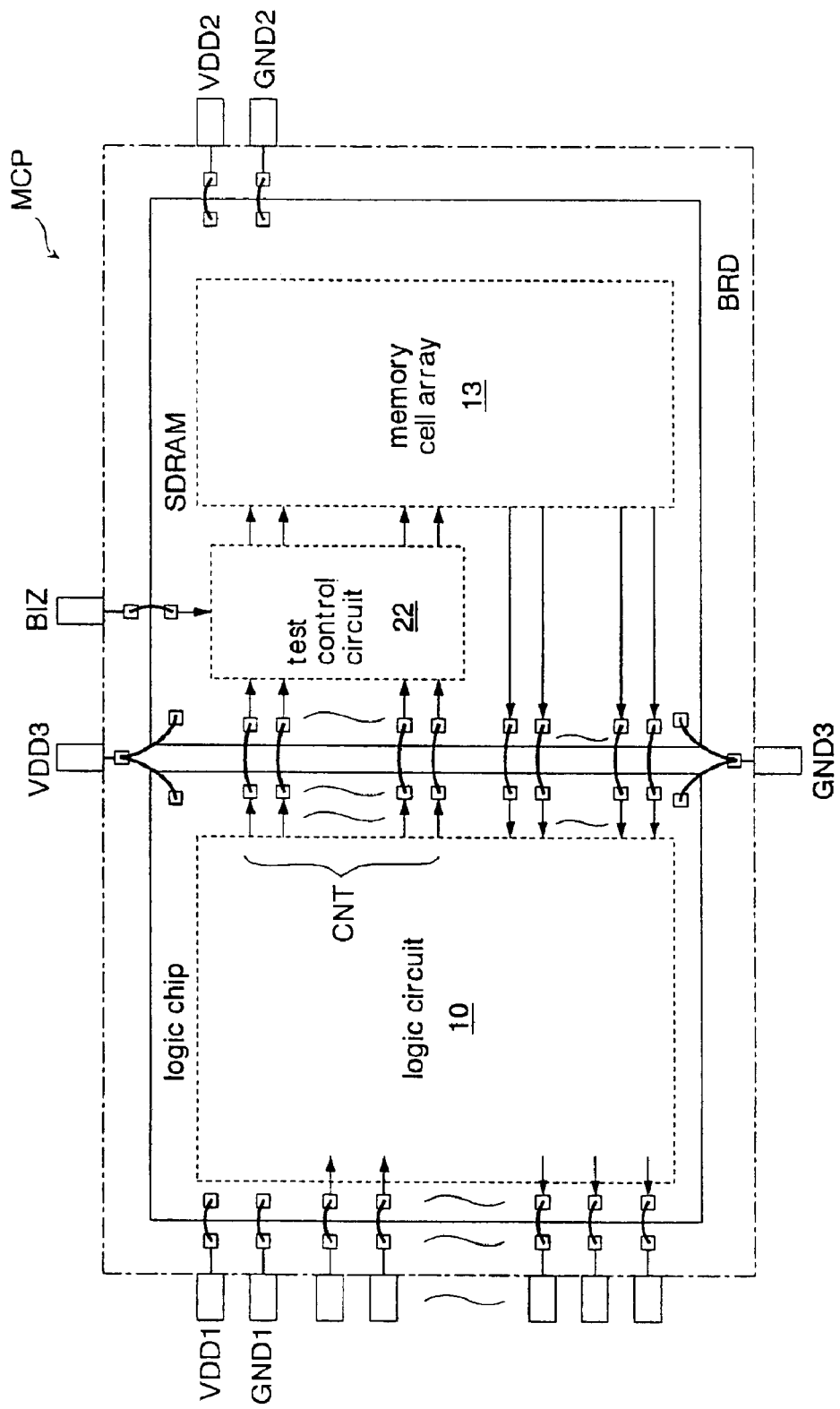
FIG. 7 is a block diagram showing a fifth embodiment of the present invention.

FIG. 7 shows a fifth embodiment of the semiconductor device of the present invention. The same elements as those of the first and second embodiments will be designated by identical reference numbers or symbols. Detailed description thereof will be omitted here.

In this embodiment, the package board BRD of the MCP has a first power supply terminal VDD1 and a first ground terminal GND1 to be connected with the power supply terminal and ground terminal of the logic chip, respectively, a second power supply terminal VDD2 and a second ground terminal GND2 to be connected with the power supply terminal and ground terminal of the SDRAM, respectively, a third power supply terminal VDD3 and a third ground terminal GND3 to be connected with the power supply terminals and ground terminals of the input/output units (IO cell units) of the logic chip and the SDRAM, respectively, a test control terminal BIZ to be connected with a test control circuit 22, and terminals to be connected with the input terminals and output terminals of the logic chip.

The test control circuit 22 is formed in the input/output unit of the SDRAM, not the logic chip. The power supply terminal and the ground terminal of the test control circuit 22 are connected to the third power supply terminal VDD3 and the third ground terminal GND3.

In this embodiment, during the burn-in test on the logic chip, the first power supply terminal VDD1 and the first ground terminal GND1 in connection with the logic chip, and the third power supply terminal VDD3 and the third ground terminal GND3 in connection with the input/output units of the logic chip and the SDRAM are connected to power supply lines. The second power supply terminal VDD2 and the second ground terminal GND2 in connection with the SDRAM are not connected to any power supply line. Consequently, during the burn-in test on the logic chip, only the logic chip, the SDRAM's input/output unit, and the test control circuit 22 are in operation.

Figure 8:
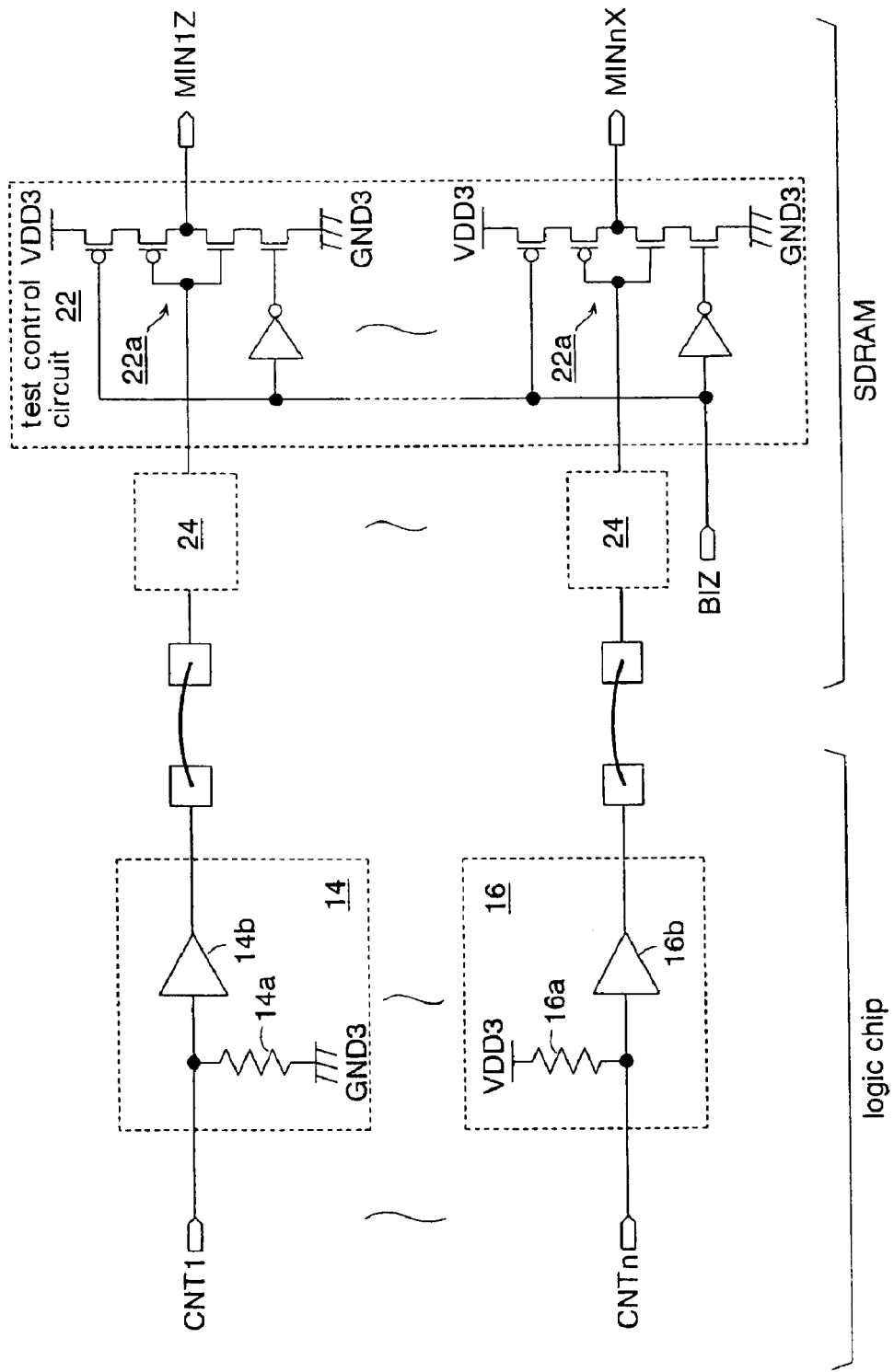
FIG. 8 is a circuit diagram showing the details of the test control circuit of FIG. 7.

FIG. 8 shows the details of the test control circuit 22 shown in FIG. 7.

The test control circuit 22 is made of the same logic as in the first embodiment (FIG. 3). More specifically, the test control circuit 22 has clocked inverters 22a (output inhibition circuits) to be activated in accordance with the test starting signal BIZ, corresponding to the respective control signals CNT (CNT1, . . . , CNTn) for operating the SDRAM. The clocked inverters 22a receive the control signals CNT (CNT1, . . . , CNTn) from the logic chip through IO cells 24, respectively. When the test starting signal BIZ is at low level (when not in burn-in test mode), the clocked inverters 22a output the received signals to the internal circuit of the SDRAM as input signals MIN1, . . . , MINn, respectively.

For example, the input signal MIN1 corresponding to the IO cell 14 having a pull-down resistor is a signal which is in an activated state when at high level. The input signal MINn corresponding to the IO cell 16 having a pull-up resistor is a signal which is in an activated state when at low level.

When the logic chip is subjected to the burn-in test, the second power supply terminal VDD2 and the second ground terminal GND2 in connection with the SDRAM are not connected to any power supply line. In addition, a high level is supplied to the test starting terminal BIZ, whereby the clocked inverters 22a are inactivated. This prevents the internal circuit of the SDRAM (memory cell array 13) from operating. The memory cell array 13 thus undergoes no stress during the burn-in test on the logic chip.

This embodiment can offer the same effects as those obtained from the first and second embodiments described above. In addition, the test control circuit 22 is connected with the dedicated power supply VDD3, GND3 which is provided for the input/output units of the logic chip and the SDRAM. This allows the test control circuit 22 to be formed inside the SDRAM. As a result, the burn-in test can be conducted on the logic chip alone even if the logic chip is a general-purpose chip.

Figure 9:
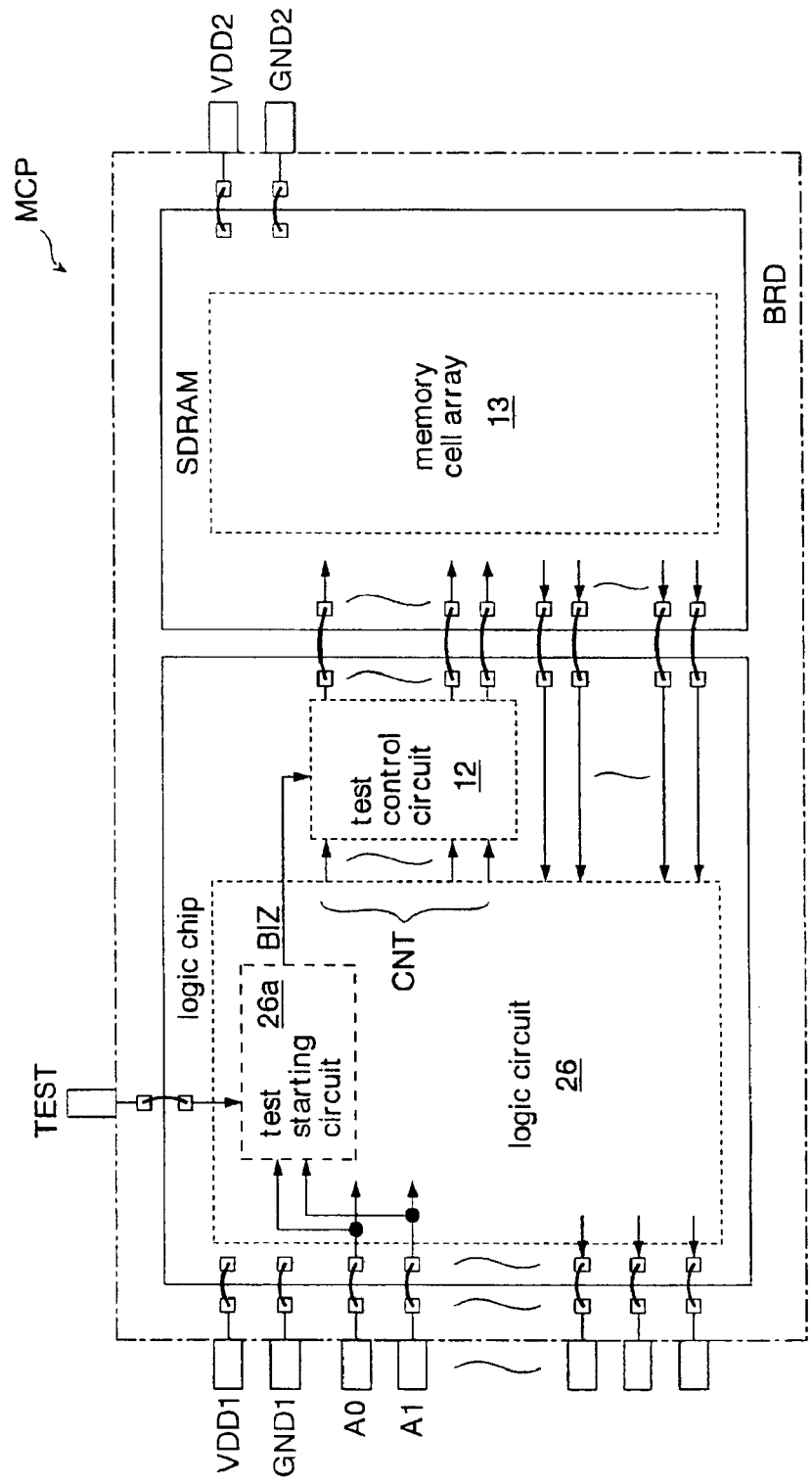
FIG. 9 is a block diagram showing a sixth embodiment of the present invention.

FIG. 9 shows a sixth embodiment of the semiconductor device of the present invention. The same elements as those of the first and second embodiments will be designated by identical reference numbers or symbols. Detailed description thereof will be omitted here.

In this embodiment, the logic chip has a plurality of test modes. Then, a logic circuit 26 of the logic chip has a test starting circuit 26a. The test starting circuit 26a is activated when a test terminal TEST receives a high level, and changes the test starting signal BIZ to high level when the signals supplied to address terminals AD0 and AD1 are "10" in logic, for example. The address terminals AD0 and AD1 receive address signals for selecting resistors of the logic chip and memory cells of the SDRAM during normal operation. The high level of the test starting signal BIZ inactivates the clocked inverters 12a (not shown) of the test control circuit 12.

The test starting circuit 26a outputs a starting signal for running a built-in self test (BIST) when the test terminal TEST receives a high level and the address terminals AD0, AD1 receive logic of "00", for example.

This embodiment can offer the same effects as those of the first embodiment described above. Moreover, the clocked inverters 12a of the test control circuit 12 are inactivated in accordance with the combination of input signals used in normal operation. Thus, a plurality of tests are feasible with fewer terminals.

Figure 10:
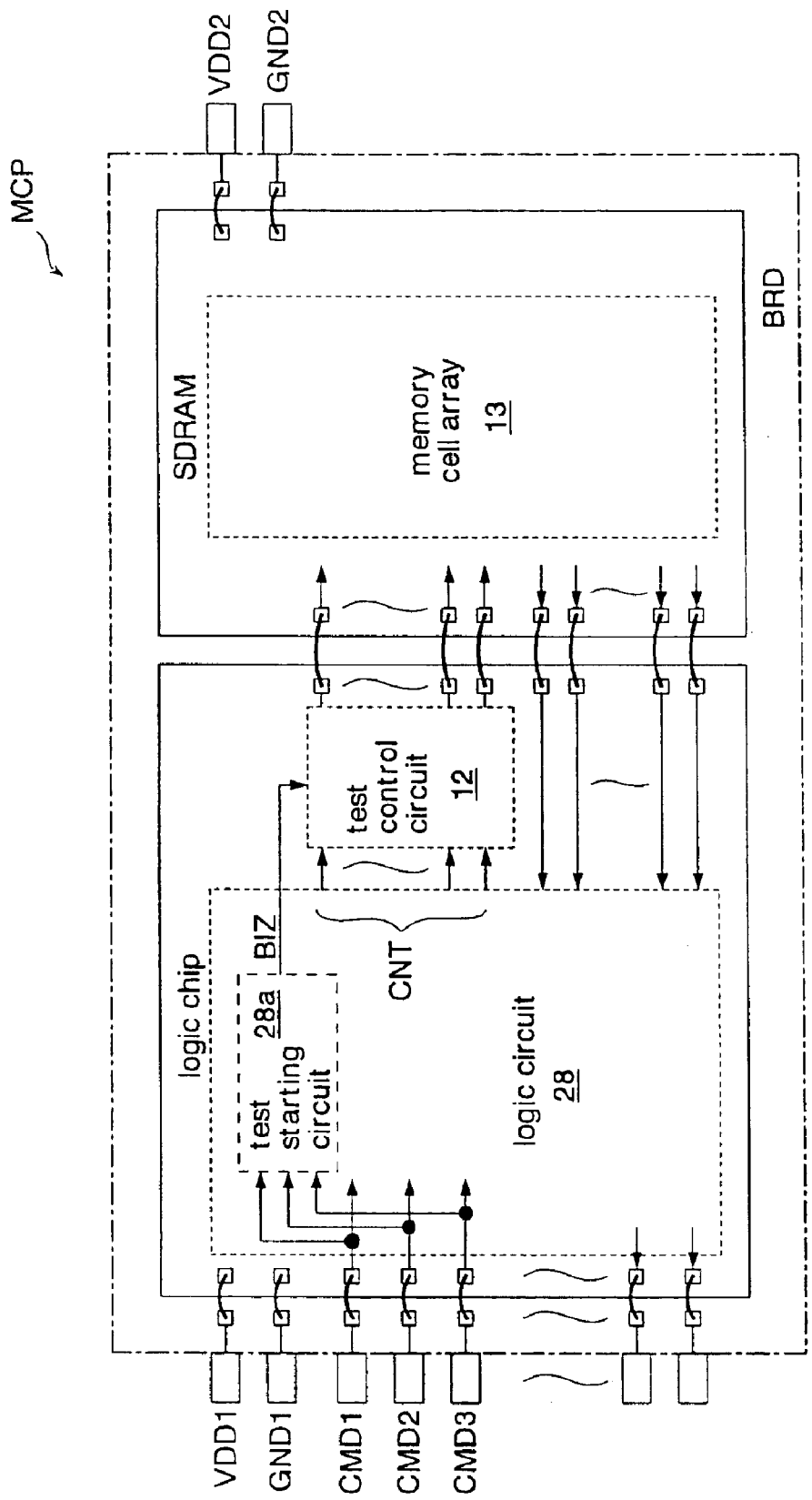
FIG. 10 is a block diagram showing a seventh embodiment of the present invention.

FIG. 10 shows a seventh embodiment of the semiconductor device of the present invention. The same elements as those of the first and second embodiments will be designated by identical reference numbers or symbols. Detailed description thereof will be omitted here.

In this embodiment, the logic chip has a plurality of test modes. Then, a logic circuit 28 of the logic chip has a test starting circuit 28a. The test starting circuit 28a changes the test starting signal BIZ to high level when the signals input to command terminals CMD1, CMD2, and CMD3 a plurality of times have a predetermined logic combination. The command terminals CMD1, CMD2, and CMD3 receive command signals for operating the logic chip and the SDRAM during normal operation. The combination of command signals to change the test starting signal BIZ to high level is one that will not be input in normal operation. When another combination of signals unused in normal operation is received, the test starting circuit 28a outputs a starting signal for running a BIST (Built-In Self Test), for example.

This embodiment can offer the same effects as those of the first embodiment described above. In addition, the test starting signal BIZ is changed to high level by using only the input terminals used in normal operation. This can eliminate the need for having test terminals.

The foregoing embodiments have dealt with the cases where the present invention is applied to an MCP containing a single logic chip and a single SDRAM. However, the present invention is not limited to such embodiments. For example, the present invention may be applied to an MCP that contains a single logic chip and a plurality of memory chips.

The invention is not limited to the above embodiments and various modifications may be made without departing from the spirit and scope of the invention. Any improvement may be made in part or all of the components.

What is claimed is:

1. A semiconductor device comprising a first chip and a second chip, said first and second chips being manufactured by mutually different manufacturing processes and packed in a single package, wherein said first chip includes:

a control circuit for generating control signals for operating said second chip; and a test control circuit for inhibiting said control signals from being transmitted to said second chip while said first chip is tested.

2. The semiconductor device according to claim 1, comprising:

a first power supply terminal intended for said first chip; and a second power supply terminal intended for said second chip, wherein said test control circuit controls output of all of said control signals to be supplied to said second chip.

3. The semiconductor device according to claim 1, comprising a power supply terminal common to said first chip and said second chip, wherein said test control circuit controls output of an enable signal, said enable signal activating said second chip and being one of said control signals to be supplied to said second chip.

4. The semiconductor device according to claim 1, wherein said first chip includes:

a test terminal for receiving a test signal for putting said first chip into a test mode;

an input terminal for receiving an input signal which is used in a normal operation; and a test starting circuit being activated upon reception of said test signal, and outputting a test starting signal in accordance with a logic of a signal input to said input terminal; and said test control circuit inhibits transmission of said control signals when receiving said test starting signal.

5. The semiconductor device according to claim 1, wherein said first chip includes:

an input terminal for receiving an input signal which is used in a normal operation; and a test starting circuit for outputting a test starting signal in accordance with a combination of logics of signals which are input to said input terminal a plurality of times; and said test control circuit inhibits transmission of said control signals when receiving said test starting signal.

6. The semiconductor device according to claim 1, comprising a test starting terminal for receiving a test starting signal for testing said first chip, wherein said test control circuit inhibits transmission of said control signals when receiving said test starting signal.

7. The semiconductor device according to claim 1, wherein said test control circuit includes output inhibition circuits for setting output nodes of said control signals to be in a high impedance state while said first chip is tested.

8. The semiconductor device according to claim 1, wherein said test control circuit includes high level fixing circuits for fixing a level of output nodes of said control signals to high level while said first chip is tested.

9. The semiconductor device according to claim 1, wherein said test control circuit includes low level fixing circuits for fixing a level of output nodes of said control signals to low level while said first chip is tested.

10. The semiconductor device according to claim 1, wherein:

said first chip is a logic chip; and said second chip is a memory chip.

11. A semiconductor device comprising a first chip and a second chip, said first and second chips being manufactured by mutually different manufacturing processes and packed in a single package, comprising:

a first power supply terminal intended for an internal circuit of said first chip;

a second power supply terminal intended for an internal circuit of said second chip; and a third power supply terminal intended for input/output circuits of said first and second chips, wherein:

said first chip includes a control circuit for generating control signals for operating said second chip;

said second chip includes a test control circuit being operative on a power supply voltage supplied to said third power supply terminal, for inhibiting said control signals from being transmitted to the internal circuit of said second chip while said first chip is tested.

12. The semiconductor device according to claim 11, comprising a test starting terminal for receiving a test starting signal for testing said first chip, wherein said test control circuit inhibits transmission of said control signals when receiving said test starting signal.

13. The semiconductor device according to claim 1, wherein said test control circuit includes output inhibition circuits for setting output nodes of said control signals to be in a high impedance state while said first chip is tested.

14. The semiconductor device according to claim 1, wherein:

said first chip is a logic chip; and said second chip is a memory chip.

15. A semiconductor integrated circuit comprising:

a control circuit for generating control signals for operating semiconductor chips which are manufactured by mutually different manufacturing processes and packed in a single package; and a test control circuit being operative in a test mode which tests the semiconductor integrated circuit, for inhibiting output of said control signals.

16. The semiconductor integrated circuit according to claim 15, comprising a test starting terminal for receiving a test starting signal, wherein said test control circuit inhibits output of said control signals when receiving said test starting signal which is for testing the semiconductor integrated circuit.

17. The semiconductor device according to claim 15, wherein said test control circuit includes output inhibition circuits for setting output nodes of said control signals to be in a high impedance state while said first chip is tested.

18. The semiconductor device according to claim 15, wherein said test control circuit includes high level fixing circuits for fixing a level of output nodes of said control signals to high level while said first chip is tested.

19. The semiconductor device according to claim 15, wherein said test control circuit includes low level fixing circuits for fixing a level of output nodes of said control signals to low level while said first chip is tested.

* * * * *